United States Patent
Wei et al.

(10) Patent No.: US 8,097,083 B2
(45) Date of Patent: Jan. 17, 2012

(54) OPERATING METHOD FOR A LARGE DIMENSION PLASMA ENHANCED ATOMIC LAYER DEPOSITION CAVITY AND AN APPARATUS THEREOF

(75) Inventors: Hung-Wen Wei, Hsin Chu Hsien (TW); Hung-Che Ting, Taipei (TW)

(73) Assignee: China Star Optoelectronics International (HK) Limited, Tsuen Wan, N. T. (HK)

( * ) Notice: Subject to any disclaimer, the term of this patent is extended or adjusted under 35 U.S.C. 154(b) by 1212 days.

(21) Appl. No.: 11/244,040

(22) Filed: Oct. 6, 2005

(65) Prior Publication Data
US 2007/0026162 A1 Feb. 1, 2007

(30) Foreign Application Priority Data
Jul. 29, 2005 (TW) .............................. 94125879 A

(51) Int. Cl.
*C23C 16/00* (2006.01)
(52) U.S. Cl. .............. 118/715; 156/345.33; 156/345.34; 427/569
(58) Field of Classification Search .................. 118/715; 156/345.33, 345.34; 427/569
See application file for complete search history.

(56) References Cited

U.S. PATENT DOCUMENTS

| | | | | |
|---|---|---|---|---|
| 5,433,520 A | * | 7/1995 | Adams et al. | 366/8 |
| 5,565,038 A | * | 10/1996 | Ashley | 134/2 |
| 6,428,859 B1 | | 8/2002 | Chiang et al. | |
| 2003/0011022 A1 | * | 1/2003 | Manabe | 257/314 |
| 2004/0013531 A1 | * | 1/2004 | Curry et al. | 417/42 |
| 2004/0217311 A1 | * | 11/2004 | Lu | 251/122 |
| 2005/0252563 A1 | * | 11/2005 | Ledo et al. | 137/884 |
| 2006/0042754 A1 | * | 3/2006 | Yoshida et al. | 156/345.1 |
| 2006/0207314 A1 | * | 9/2006 | Kitazawa et al. | 73/49.2 |

FOREIGN PATENT DOCUMENTS

| TW | 563176 | 11/2003 |
|---|---|---|
| TW | 578212 | 3/2004 |

* cited by examiner

*Primary Examiner* — Ram Kackar
*Assistant Examiner* — Satish Chandra
(74) *Attorney, Agent, or Firm* — Cheng-Ju Chiang

(57) ABSTRACT

An operating method for a large dimension plasma enhanced atomic layer deposition cavity and an apparatus thereof are provided. The present invention reduces the time needed for filling the manufacturing gas into the large volume manufacturing cavity. Therefore, the plasma enhanced atomic layer deposition apparatus can switch the precursors rapidly to increase the thin film deposition rate, reduce the manufacturing gas consumption and lower the manufacturing cost.

6 Claims, 14 Drawing Sheets

OPERATING METHOD FOR A LARGE DIMENSION PLASMA ENHANCED ATOMIC LAYER DEPOSITION CAVITY AND AN APPARATUS THEREOF

BACKGROUND OF THE INVENTION

1. Field of the Invention

The present invention relates to an operating method and an apparatus thereof. In particular, this invention provides an operating method for a large dimension plasma enhanced atomic layer deposition cavity and an apparatus thereof.

2. Description of the Related Art

Currently, the $SiO_2$ layer in the gate port for thin-film-transistors (TFTs) is formed by the plasma enhanced CVD method or the thermal CVD method. While plate displays have become larger, the manufacturing temperature and the number of transistors used have both decreased, and the $SiO_2$ layer in the gate port has become thinner. However, the required driving voltage for the $SiO_2$ layer has risen and some problems have consequently come to the fore, such as high leakage current and lower element reliability. A high dielectric material atomic layer thin film made by the plasma enhanced atomic layer deposition (PEALD) uses a nano-thickness layer to cover a large dimension substrate. The plasma enhanced atomic layer deposition controls the high dielectric material nano-thin-film deposition with low manufacturing temperature, low pollution and precise atomic thickness. Due to the development of high efficiency materials and low voltage element structures, organic light emitting diodes (OLEDs) focus on the electrode interface. The buffer layer is made of material with several atomic layers of thickness. The thin-film is deposited by the atomic layer deposition method.

The plasma enhanced atomic layer deposition adopts a continuous bi-chemical reaction. The deposition of a chemical precursor will be self-limiting. Next, the ligand excision and the surface activation are processed by utilizing an ionic group and/or an atomic group produced from the plasma. At the first semi-reaction, the gaseous chemical precursor reacts with the surface functional group. The reaction is processed continuously until all of the surface functional group has been reacted and replaced. This is the self-limiting characteristic of the atomic layer deposition. The free radical of the ionic group and the atomic group coming from the plasma forms vaporizable particles and excises the surface ligand to reserve the desired deposition surface layer. When the free radicals of the atomic group make the surface activate, the ionic effect make the deposition thin film tighten and crystallize. So, the plasma enhanced atomic layer deposition has a faster reaction speed and a faster vaporized product excision than the atomic layer deposition (ALD) at a lower temperature.

Because the first semi-reaction is self-limiting, an atomic layer deposition formed at every cycle is expected if the ionic group and the atomic group do not suffer from deposition reaction product etching. In the micro electronic manufacturing process, the plasma enhanced atomic layer deposition is extensively applied to deposit high dielectric gate oxidation layer material, inert refractory metal, diffusion barrier, and seed and metal nitrides of adhesion layers.

The principle of the atomic layer deposition is to expose the substrate's surface that deposits a thin film to a plurality of precursors replacing each other in cycle and purging gas. The deposition speed of the thin film is determined by the replacement period. In a unit time, the greater the replacement speed, the greater the deposition speed. In order to increase the switching speed of the plurality of precursors in a large dimension plasma enhanced atomic layer deposition apparatus, the gas distributing pipes for the plurality of precursors and purge gas are installed in the large dimension cavity. Furthermore, the high speed valve of each gas distributing pipe is installed near the cavity. Therefore, the plasma enhanced atomic layer deposition apparatus can switch the precursors in high speed to speed up the thin film deposition speed. Because the plasma needs to be operated in a specified pressure to absorb the RF power effectively and transfer the gas into plasma, it is necessary to control the pressure in the large dimension plasma enhanced atomic layer deposition cavity. The quantity of the precursors needs to be reduced and the gas-flow of the exhaust pipe increases in a short time to draw out the gas that does not completely react quickly. The throttle valve of the prior art that is used to control the pressure cannot increase or decrease the gas-flow of the exhaust pipe in a timely manner.

U.S. Pat. No. 6,428,859, "Sequential method for depositing a film by modulated ion-induced atomic layer deposition (MII-ALD)", belongs to Angstron Systems. Their method uses a showerhead partition to separate the plasma cavity and the manufacturing cavity. The precursor gas that needs to be ionized is introduced into the plasma cavity, is ionized by the plasma, is drawn out by a vacuum pump via the showerhead, and then spreads to the substrate's surface in the manufacturing cavity. The precursor gas that does not need to be ionized is introduced into the manufacturing cavity directly and reacts with the substrate's surface. Because the precursor gas needs to spread out over the plasma cavity and fill the manufacturing cavity so that a reaction occurs on the substrate's surface, the time required for spreading gas into the cavity becomes longer when the substrate's dimensions and the volume of the cavity increases.

T.W. patent 563,176, "A gas transmitting apparatus for atomic layer deposition" belongs to Applied Material. Their apparatus uses a manufacturing cavity of small volume to make the precursor gas quickly spread to the manufacturing cavity full.

T.W. patent 578,212, "Atomic layer deposition reactor" belongs to ASM. It adopts a thermal cracking and plasma enhanced method for the atomic layer deposition apparatus. According to the plasma source, the plasma enhanced is classified into a capacitor couple plasma source and a inductor couple plasma source. Each plasma source is classified into a far side plasma source and a near side plasma source depending upon whether the substrate is dipped into the plasma or not. However, every cavity has only one inlet extending from one side of the cavity to another side of the cavity. When the volume of the cavity increases, the time needed for spreading gas into the cavity full becomes longer and lowers the switching rate for the gas.

In the throttle valve of the prior art used for controlling the pressure, the pressure in the cavity can be measured by a capacitor pressure gauge when the pressure is controlled. Next, the measured pressure is transmitted to a pressure controller via a direct current signal. The pressure controller compares the pre-determined pressure with the measured pressure obtained from the capacitor pressure gauge to adjust the position of the throttle valve. Thereby, the pressure in the cavity is the same as the pre-determined pressure. The throttle valve has two kinds of operating methods. The first is the same as the operation of the gate valve. The valve intersects with the cross-section of the pipe to control the gas-flow of the pipe. This valve can be used for an exhaust pipe with a large bore and it is hermetically sealed. When the valve is fully closed, it is the same as the gate valve and does not suffer from the problem of gas-exhaust. The position of the valve is controlled by a servomotor or a step motor.

The other operation requires that a valve that has the shape of butterfly wings be rotated to adjust the position of the valve. It is called a butterfly valve. The butterfly valve comprises a rotatable valve and a servomotor or a step motor used for adjusting the position of the valve. The servomotor automatically adjusts the position of the valve to change the conductance of the throttle valve via an inputting voltage signal. Therefore, the efficiency of the exhaust gas for the total system is controlled and the purpose of automatically controlling the pressure is achieved. Furthermore, in order to reduce the consumption of the chemical precursor, Sundew Technologies Company introduced nitrogen or inert gas into the exhaust pipe when the chemical precursor is inputted to reduce the exhaust-gas quantity of the exhaust pipe. Therefore, the pressure of chemical precursor in the manufacturing cavity increases quickly and the deposition rate of the chemical precursor also increases. The gas introduced into the exhaust pipe is called a ballast gas. When the manufacturing cavity is purified, a purifying gas (such as nitrogen or inert gas) is introduced and the ballast gas is exhausted. The gas-flow in the exhaust pipe increases and the gas in the cavity is quickly exhausted in order to purify the cavity.

The merit of the above design is the structure is simple. Only the size of the pipe for the ballast gas needs to be increased and a pneumatic valve must be added. Thereby, the gas-flow in the exhaust pipe is reduced, the deposition rate of the chemical precursor is increased and the gas-flow in the exhaust pipe is recovered quickly. However, there are some drawbacks. First, additional inert or nitrogen gas is consumed in every deposition manufacturing process. Second, the pressure in the cavity cannot be controlled effectively. For using the plasma, if the pressure cannot be controlled effectively, the power rate of the RF cannot be inputted effectively and the plasma cannot be ignited. Third, the nitrogen atom may be merged into the thin film in the thin film deposition process and the characteristics of the atomic layer thin film will be affected. Therefore, this method is not suitable for being used in the plasma enhanced atomic layer deposition apparatus.

SUMMARY OF THE INVENTION

One particular aspect of the present invention is to effectively control the pressure in a large dimension plasma enhanced atomic layer deposition cavity. The present invention increases the gas-flow in the exhaust pipe quickly to exhaust the gas from the cavity. The present invention adds a rotatable valve inside the exhaust pipe and the position of the rotatable valve's bearing can be moved to control the gas-flow in the exhaust pipe when the chemical precursor is deposited.

The present invention provides an operating method for a large dimension plasma enhanced atomic layer deposition cavity. The method includes inputting a pneumatic valve frequency signal to make a purifying gas enter into the large dimension plasma enhanced atomic layer deposition cavity. Next, a pressure signal is outputted to a rotatable throttle valve controller to generate a valve position signal and a rotating frequency signal. Third, the rotatable throttle valve is closed and a first gas is filled into the large dimension plasma enhanced atomic layer deposition cavity. Fourth, a pneumatic valve frequency signal is inputted to make a purifying gas enter into the large dimension plasma enhanced atomic layer deposition cavity. Fifth, a pressure signal is outputted to a rotatable throttle valve controller to generate a valve position signal and a rotating frequency signal. Sixth, the rotatable throttle valve is closed and a second gas is filled into the large dimension plasma enhanced atomic layer deposition cavity; a pneumatic valve frequency signal is inputted to make a purifying gas enter into the large dimension plasma enhanced atomic layer deposition cavity. Seventh, a pressure signal is outputted to a rotatable throttle valve controller to generate a valve position signal and a rotating frequency signal; a rotatable throttle valve is opened via the valve position signal and a rotating frequency signal to exhaust the purifying gas from the large dimension plasma enhanced atomic layer deposition cavity.

The present invention also provides an apparatus of a large dimension plasma enhanced atomic layer deposition cavity to achieve the above method.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
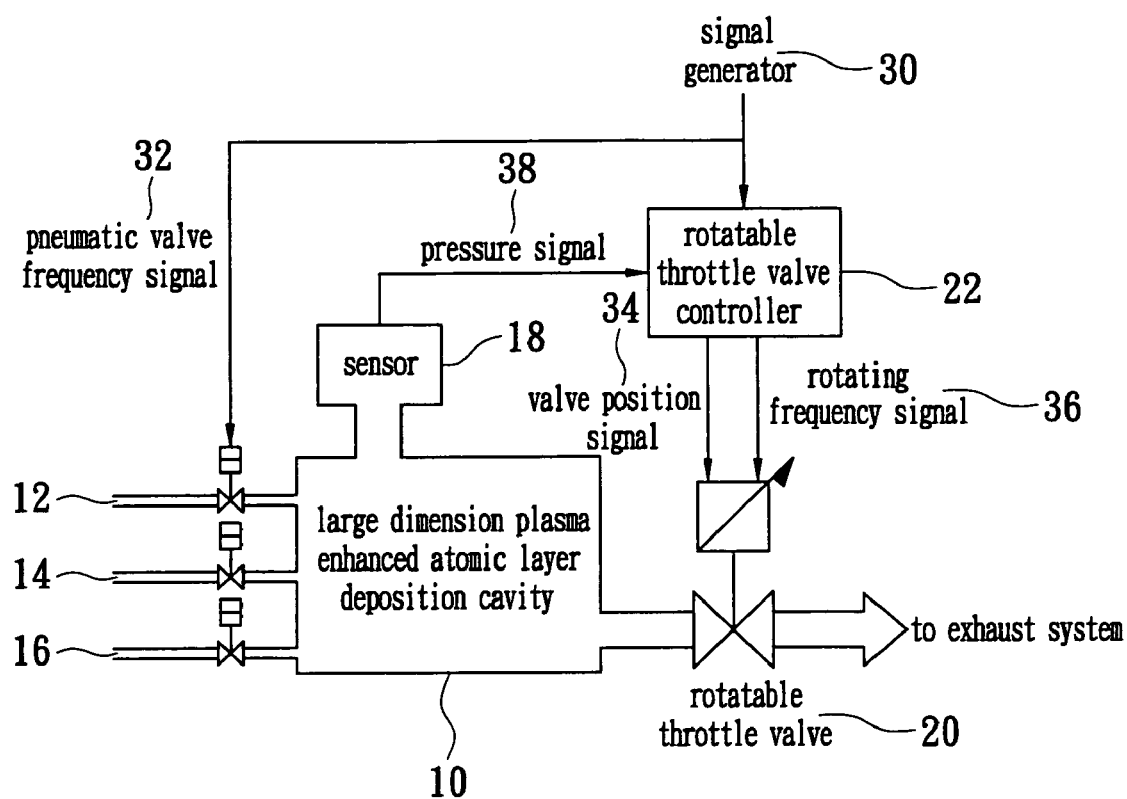
FIG. 1 is a schematic view of the apparatus of a large dimension plasma enhanced atomic layer deposition cavity of the present invention.

Reference is made to FIG. 1. FIG. 1 shows a schematic view of the apparatus of a large dimension plasma enhanced atomic layer deposition cavity of the present invention. The apparatus of a large dimension plasma enhanced atomic layer deposition cavity includes a large dimension plasma enhanced atomic layer deposition cavity 10, a first gas supply source 12, a second gas supply source 14, a purifying gas supply source 16 and a sensor 18, a rotatable throttle valve 20 and a rotatable throttle valve controller 22. The large dimension plasma enhanced atomic layer deposition cavity 10 defines a reaction space. The first gas supply source 12 is connected to one side of the large dimension plasma enhanced atomic layer deposition cavity 10 for providing a first gas. The second gas supply source 14 is connected to one side of the large dimension plasma enhanced atomic layer deposition cavity 10 for providing a second gas. The purifying gas supply source 16 is connected to one side of the large dimension plasma enhanced atomic layer deposition cavity 10 for providing a purifying gas. The sensor 18 is installed at one side of the large dimension plasma enhanced atomic layer deposition cavity 10 and is interlinked with the reaction space for sensing the pressure in the reaction space.

The rotatable throttle valve 20 is installed at one side of the large dimension plasma enhanced atomic layer deposition cavity 10 and is interlinked with the reaction space. The rotatable throttle valve 20 is used for exhausting the first gas 12, the second gas 14 and the purifying gas 16 in the reaction space. The rotatable throttle valve controller 22 receives a pressure signal 38 outputted from the sensor 18 to generate a valve position signal 34 and a rotating frequency signal 36 to control the rotatable throttle valve 20. The pressure signal 38 is outputted from the sensor 18. The pneumatic valve frequency signal 32, the valve position signal 34 and the rotating frequency signal 36 are outputted from a signal generator 30.

Figure 2:
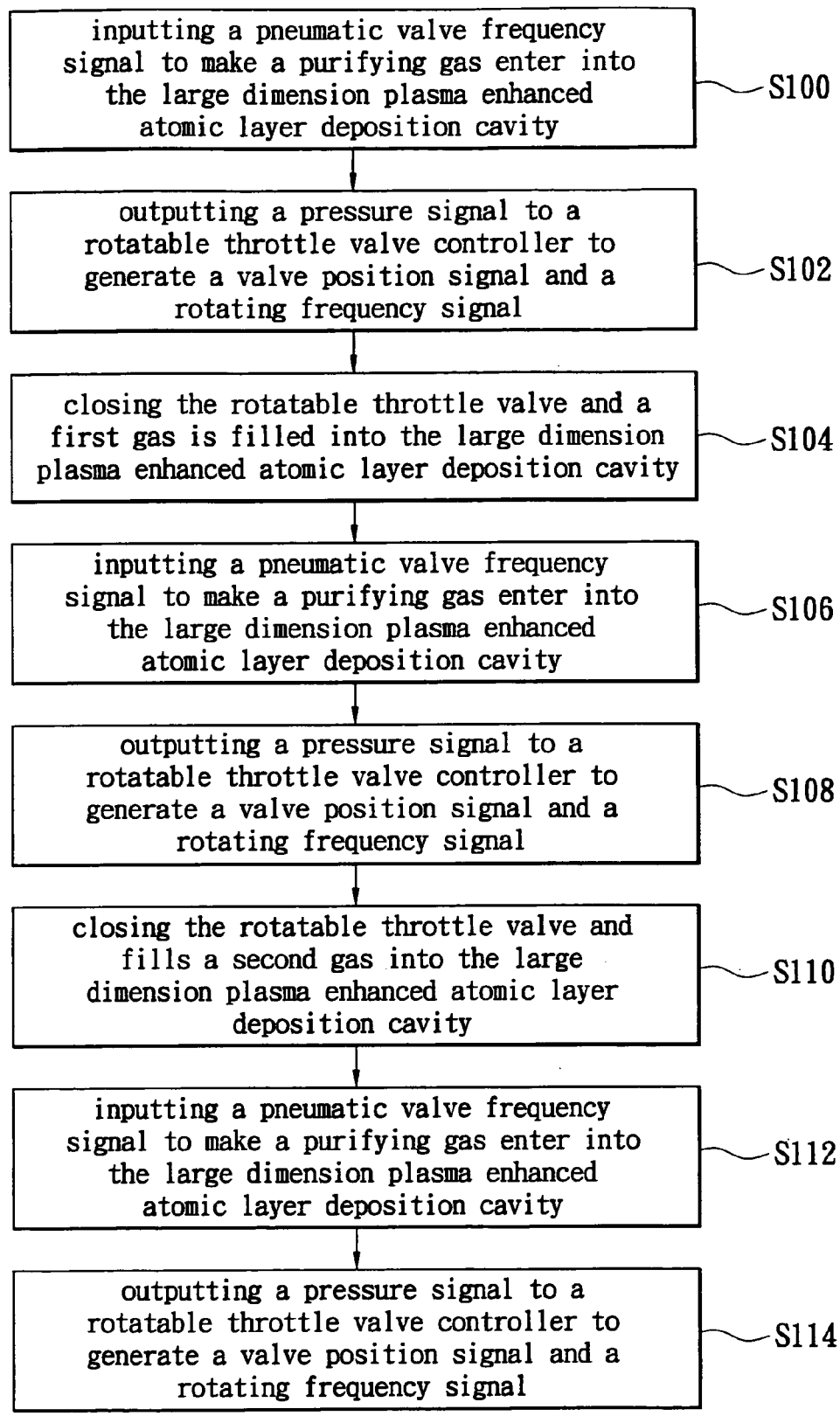
FIG. 2 is a flow chart of the operating method for a large dimension plasma enhanced atomic layer deposition cavity of the present invention.

FIG. 2 shows a flow chart of the operating method for a large dimension plasma enhanced atomic layer deposition cavity of the present invention. The method includes inputting a pneumatic valve frequency signal to make a purifying gas enter into the large dimension plasma enhanced atomic layer deposition cavity (S100). Next, a pressure signal is outputted to a rotatable throttle valve controller to generate a valve position signal and a rotating frequency signal (S102). Third, the rotatable throttle valve is closed and a first gas is filled into the large dimension plasma enhanced atomic layer deposition cavity (S104). Fourth, a pneumatic valve frequency signal is inputted to make a purifying gas enter into the large dimension plasma enhanced atomic layer deposition cavity (S106). Fifth, a pressure signal is outputted to a rotatable throttle valve controller to generate a valve position signal and a rotating frequency signal (S108). Sixth, the rotatable throttle valve is closed and fills a second gas into the large dimension plasma enhanced atomic layer deposition cavity (S11O); a pneumatic valve frequency signal is inputted to make a purifying gas enter into the large dimension plasma enhanced atomic layer deposition cavity (S112). Seventh, a pressure signal is outputted to a rotatable throttle valve controller to generate a valve position signal and a rotating frequency signal (S114). A rotatable throttle valve is opened via the valve position signal and a rotating frequency signal to exhaust the purifying gas from the large dimension plasma enhanced atomic layer deposition cavity.

Figure 3:
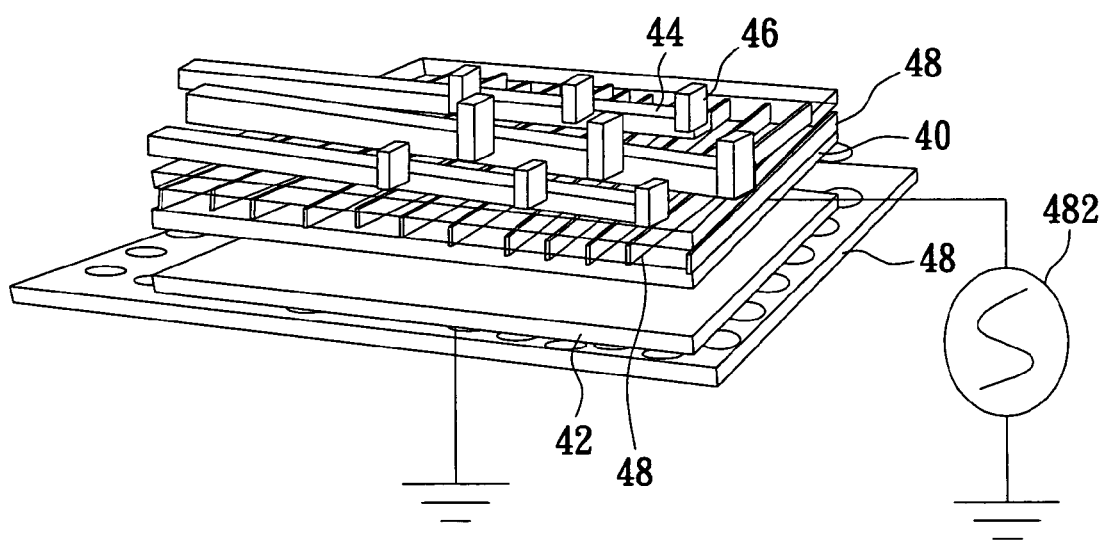
FIG. 3 is a schematic view of a large dimension plasma enhanced atomic layer deposition cavity of the present invention used for filling gas quickly.
Figure 4:
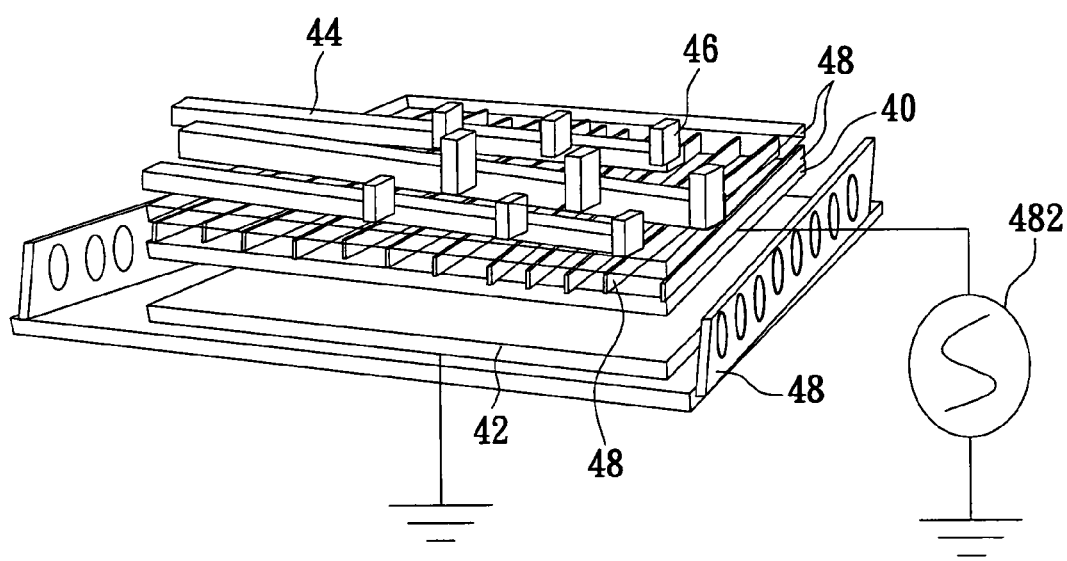
FIG. 4 is a schematic view of the second embodiment of a large dimension plasma enhanced atomic layer deposition cavity of the present invention used for filling gas quickly.
Figure 5:
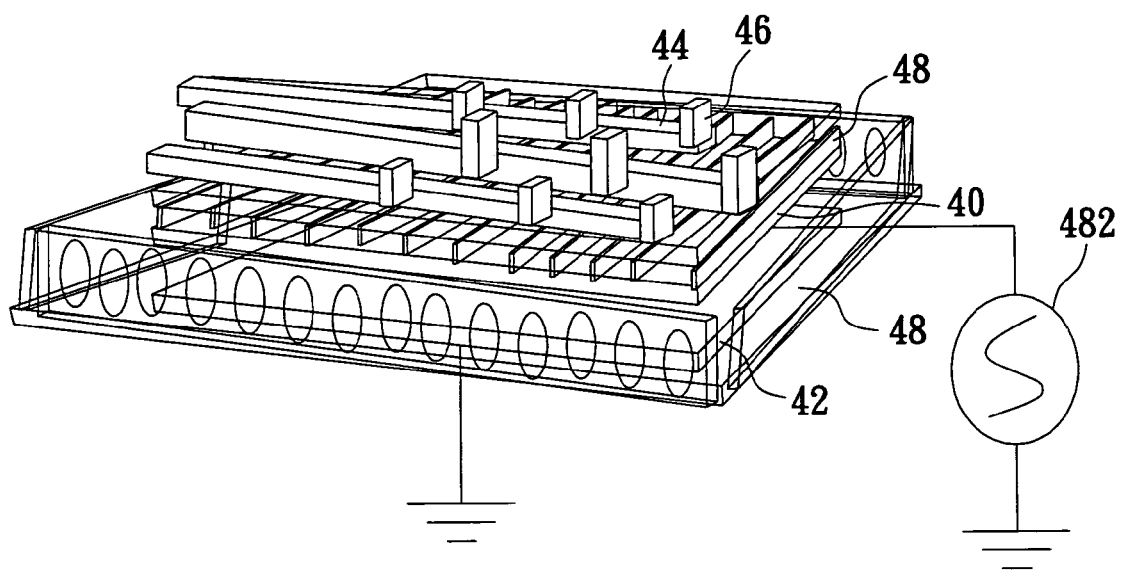
FIG. 5 is a schematic view of the second embodiment of a large dimension plasma enhanced atomic layer deposition cavity of the present invention used for filling gas quickly.

Please refer to FIG. 3, which shows a schematic view of a large dimension plasma enhanced atomic layer deposition cavity of the present invention used for filling gas quickly. The large dimension plasma enhanced atomic layer deposition cavity includes an upper electrode plate 40 and a lower electrode plate 42. The lower electrode plate 42 is grounded. At least one gas pipe 44 is installed on the upper electrode plate 40. At least one fast gas valve 46 is installed above the gas pipe 44. At least one insulation material 48 is installed under the gas pipe 44, above the upper electrode plate 40 and around the lower electrode plate 42 to keep the three separated. The insulation material 48 can be ceramic, quartz or another material that can be used for insulation. The insulation material 48 is spread around the surroundings or the two sides of the lower electrode plate 42 having holes for exhausting the gas. FIG. 4 shows a schematic view of the second embodiment of a large dimension plasma enhanced atomic layer deposition cavity of the present invention used for filling gas quickly. FIG. 5 shows a schematic view of the second embodiment of a large dimension plasma enhanced atomic layer deposition cavity of the present invention used for filling gas quickly. A RF power supply 482 is connected with one side of the upper electrode plate 40.

In order to increase the switching rate of the plurality of precursors in the large dimension plasma enhanced atomic layer deposition cavity, the large dimension plasma enhanced atomic layer deposition cavity has a plurality of gas distributing pipes for the plurality of precursors and the purifying gas. The fast valve of each gas-distributing pipe is installed near the cavity so that the plasma enhanced atomic layer deposition apparatus switches the precursors rapidly to increase the deposition rate of the thin film.

The electrode plate in the manufacturing cavity is installed with gas distributing pipes and each gas distributing pipe has a gas valve that can be opened and closed quickly and is installed before the cavity so that the gas fills the gas distributing pipe to reduce the time needed for transmitting and filling. When the gas is transmitted, the fast gas valve on the same gas-distributing pipe is operated to introduce the precursor into the manufacturing cavity.

Figure 6:
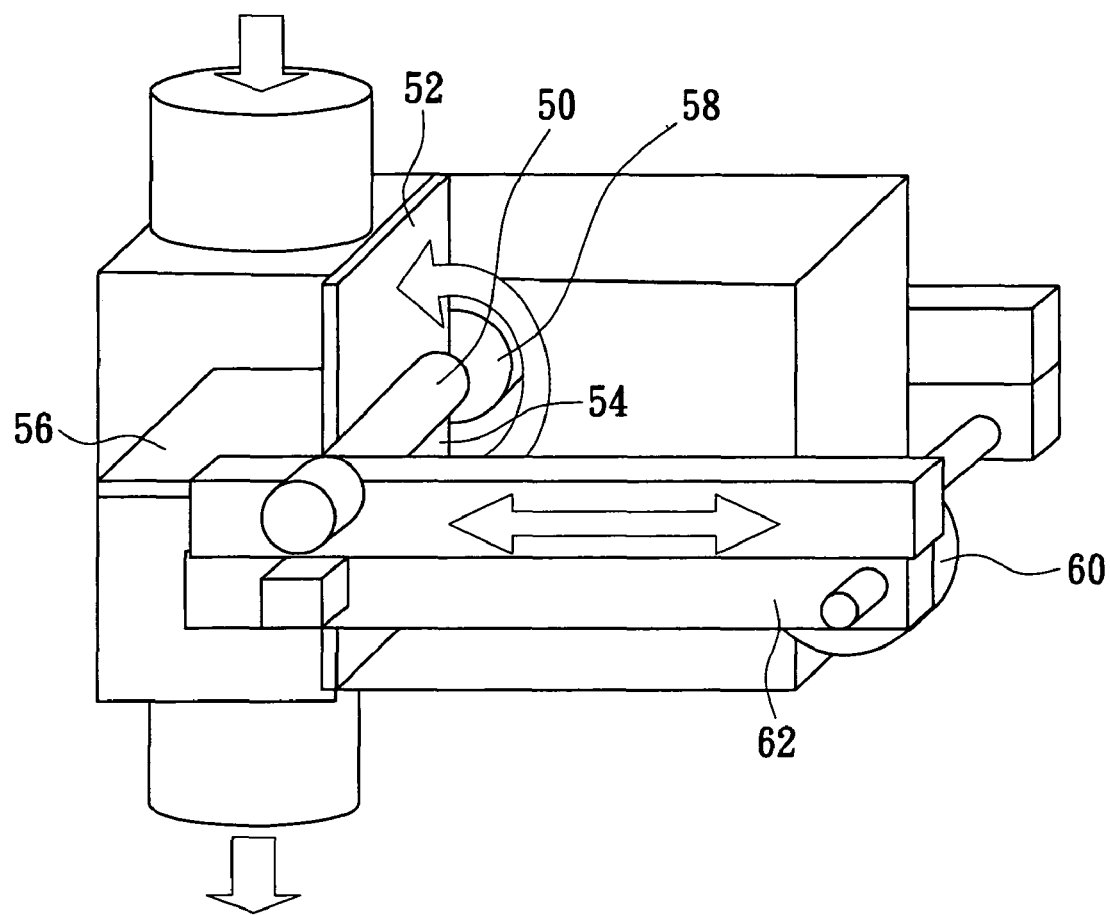
FIG. 6 is a schematic view of the first embodiment of the throttle valve of the present invention.

FIG. 6 shows a schematic view of the first embodiment of the throttle valve of the present invention. The present embodiment uses a magnetic force to make the bearing base 62 move linearly. The rotatable valve 58 is composed of three blades. The blade 56 is used for controlling the cross-section of the pipe to change the gas-flow of the exhaust pipe. The other blades 52 and 54 are used for sealing the movement space or opening of the rotatable valve 58 to reduce gas loss. If gas-flow of the exhaust pipe needs to be increased, the rotatable valve 58 is rotated 180 degrees to the side without the valve's blade. In this state, the gas-flow of the exhaust pipe is its largest and co-operates with the rotating frequency to reduce consumption of the precursor and rapidly changes the gas-flow. The bearing seal of the rotating machine feedthrough is an O-ring or a Y-ring, or is linked by a magnetic force. By controlling the position of the bearing base of the rotatable valve 58, the cross-section of the exhaust pipe is changed when the rotatable valve 58 is closed.

Figure 7:
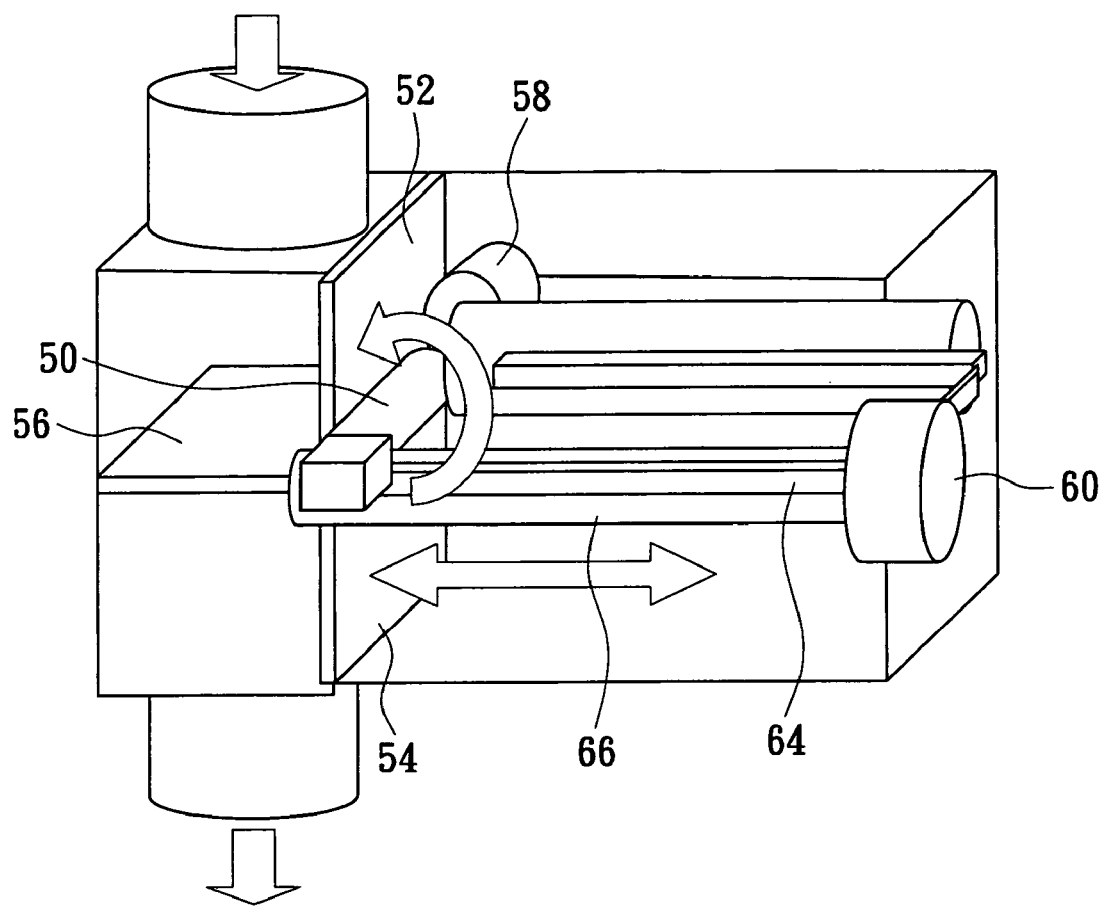
FIG. 7 is a schematic view of the second embodiment of the throttle valve of the present invention.

The linear movement machine feedthrough is implemented by using a step motor 60 to drive a belt, a chain or a rack to change the position of the bearing base via a magnetic force. Alternatively, the linear movement machine feedthrough is implemented by a step motor 60 driving a screw rod 64 to change the position of the bearing base of the rotatable valve 56, and is sealed with a ripple pipe (as shown in FIG. 7). The above operation is cooperated with the frequency of the valve operations of the chemical precursor and the purifying gas.

Figure 8:
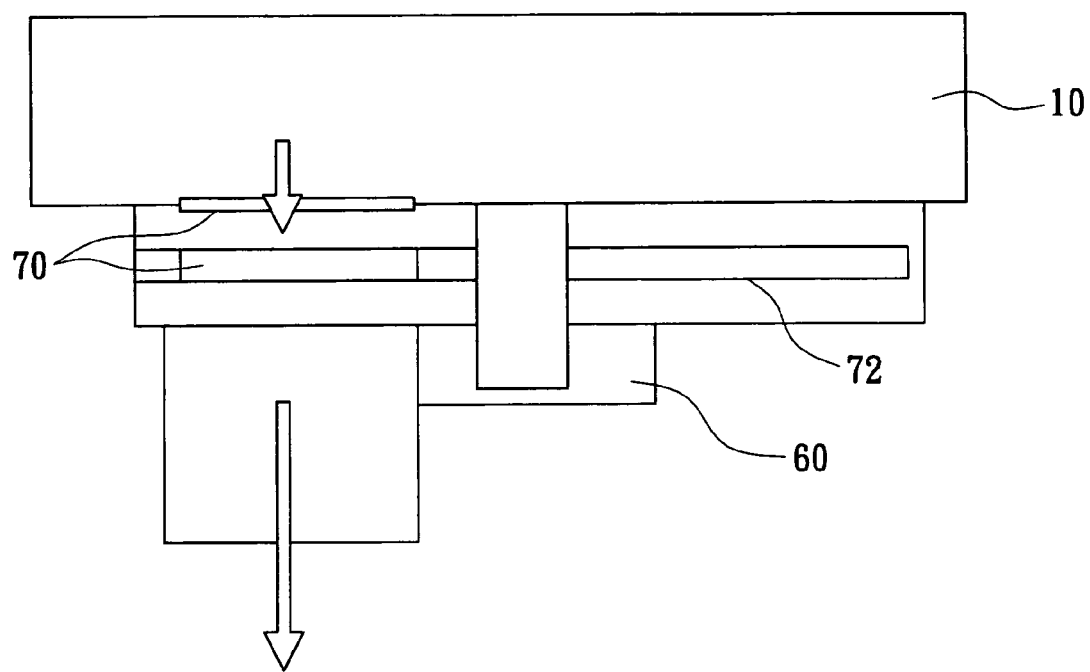
FIG. 8 is a schematic view of the third embodiment of the throttle valve of the present invention.
Figure 9:
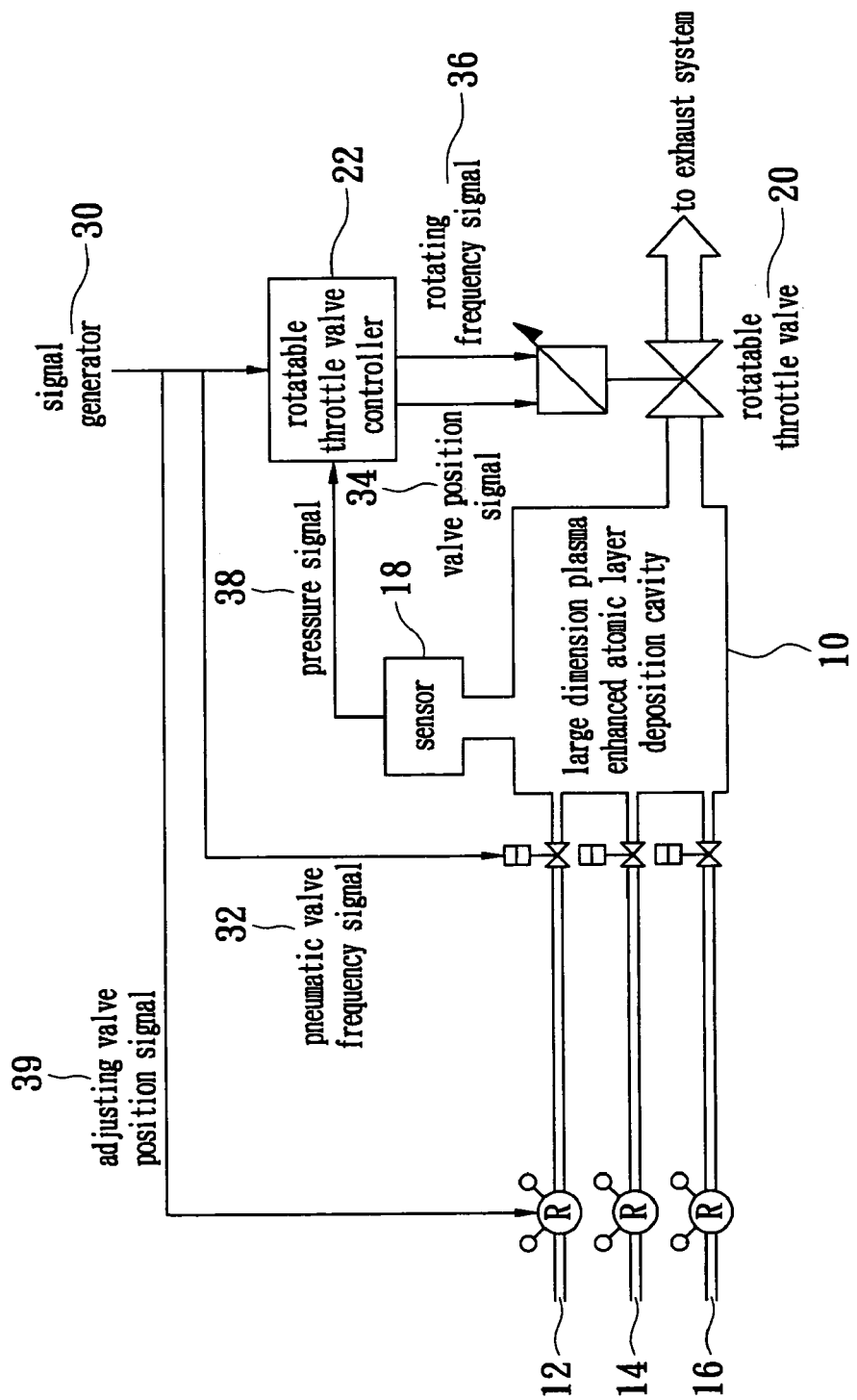
FIG. 9 is a schematic view of rotatable disks in the third embodiment of the throttle valve of the present invention.
Figure 10:
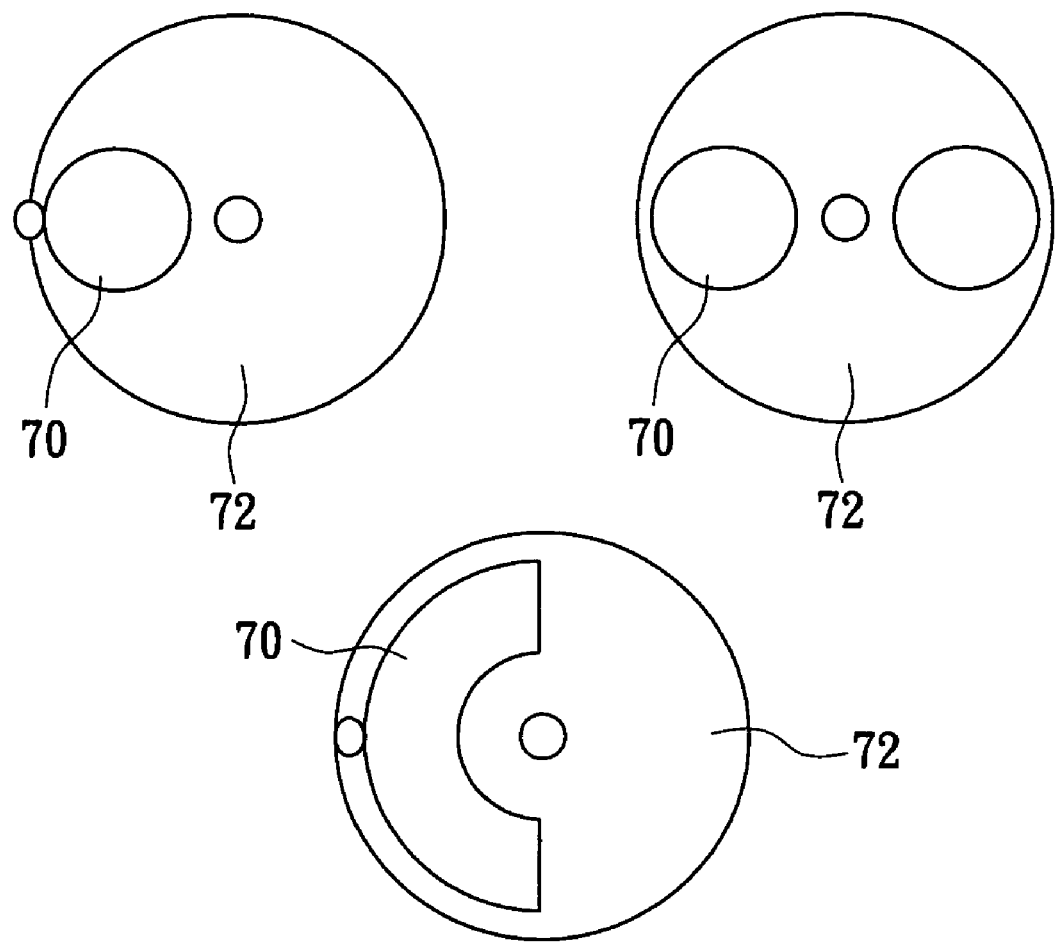
FIG. 10 is a schematic view of the control signals in the third embodiment of the throttle valve of the present invention.
Figure 11A:
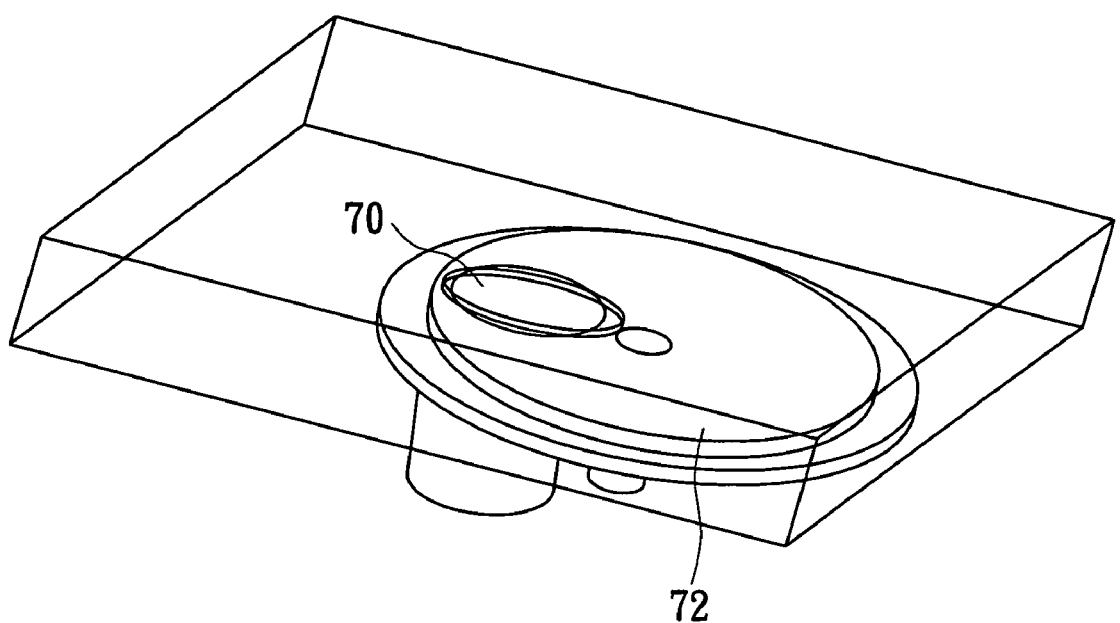
FIG. 11A is a schematic view of the rotatable disk with a signal hole in the third embodiment of the throttle valve of the present invention.
Figure 11B:
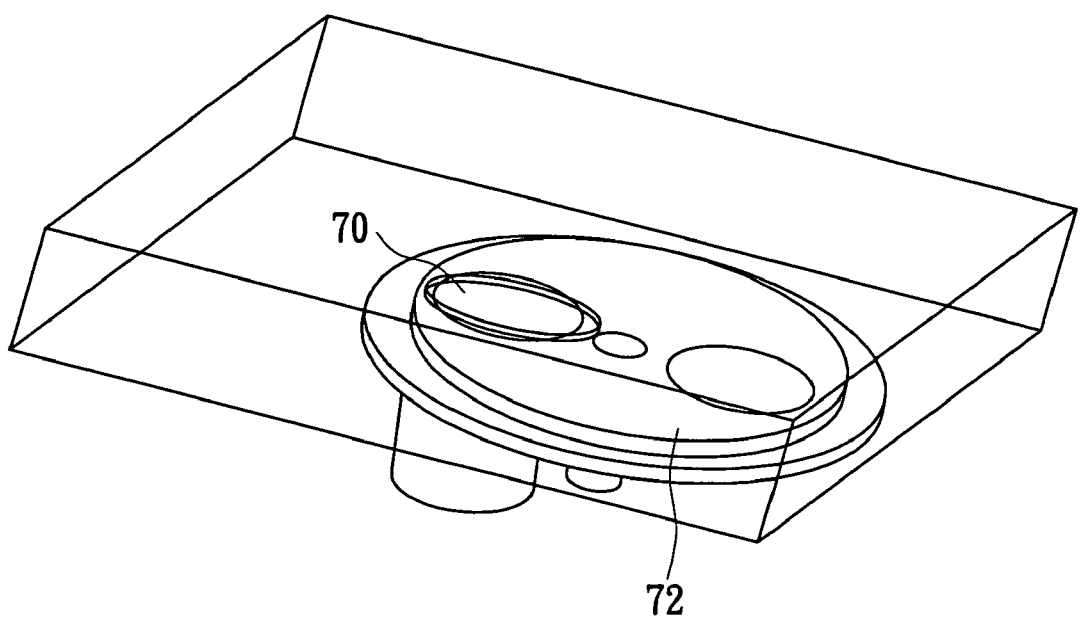
FIG. 11B is a schematic view of the rotatable disk with two holes in the third embodiment of the throttle valve of the present invention.
Figure 11C:
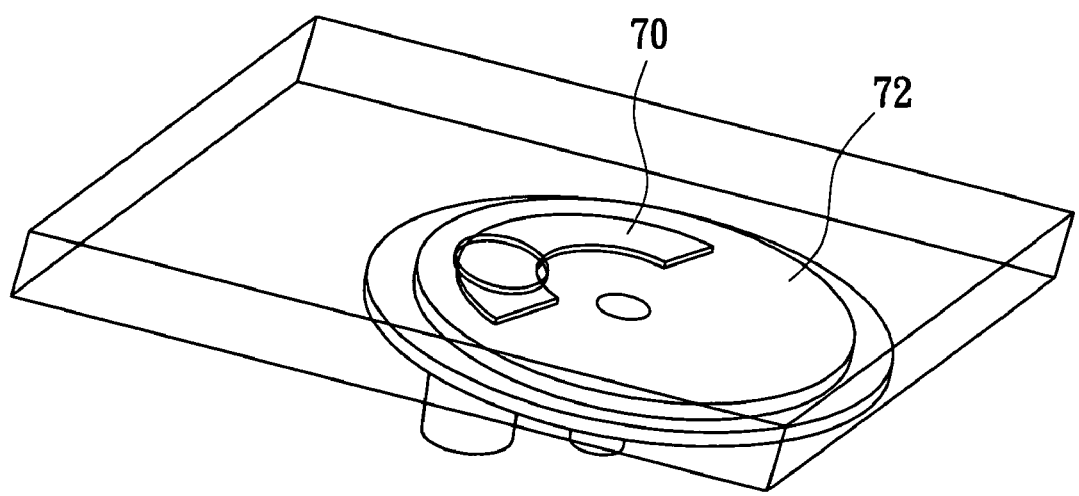
FIG. 11C is a schematic view of the rotatable disk with a signal non-circular hole in the third embodiment of the throttle valve of the present invention.

FIG. 8 shows a schematic view of the third embodiment of the throttle valve of the present invention. The present embodiment uses a rotating disk 72 with a hole 70 for rotating. The hole 72 of the rotating disk 72 is used for controlling the cross-section of the pipe. When the hole 72 of the rotating disk 72 is on the exhaust pipe, the exhaust pipe is fully open. When the hole 72 of the rotating disk 72 is rotated to its other position, the exhaust pipe is completely closed. The opening and closing frequency of the exhaust pipe's gas-flow is changed by the rotating speed of the rotating disk 72. The rotating disk 72 is driven by the servomotor 60 and controls the position of the hole 70. This method is suitable for the large dimension plasma enhanced atomic layer deposition cavity 10. It does not occupy much space and is more suitable for an exhaust pipe with a large bore. However, the rotating valve can only control the exhaust pipe when it is open or closed and fine-tuning the gas-flow in the exhaust pipe is not easy. Therefore, the pressure in the manufacturing cavity is controlled by controlling the quantity of gas entering into the cavity via the gas-transmitting pipe. If the opening time for the fast valve of the gas-transmitting pipe is fixed, the pressure in the gas-transmitting pipe is adjusted according to the pressure in the cavity (as shown in FIG. 9). When there is not enough pressure in the cavity, the signal generator 30 feeds back an adjusting valve position signal 39 to an adjusting pressure valve of the gas-transmitting pipe to increase the pressure in the pipe. When there is too much pressure in the cavity, the adjusting valve position signal 39 is fed back to the adjusting pressure valve of the gas-transmitting pipe to lower the pressure in the pipe. FIG. 10 is a schematic view of the control signals in the third embodiment of the throttle valve of the present invention. FIG. 11A is a schematic view of the rotatable disk with a signal hole in the third embodiment of the throttle valve of the present invention. FIG. 11B is a schematic view of the rotatable disk with two holes in the third embodiment of the throttle valve of the present invention. FIG. 11C is a schematic view of the rotatable disk with a signal non-circular hole in the third embodiment of the throttle valve of the present invention. The rotatable disk 72 includes at least one hole 70. Because there is a hole in the rotatable disk, the rotating moment of the rotatable disk is unbalanced. Therefore, a mass is added in the outer fringe of the rotatable disk that is relative to the hole's 70 position to balance the rotating moment. If there are two holes in the rotating disk and the holes are symmetrical with each other, the rotating moment is balanced without adding any mass on the outer fringe of the rotatable disk.

Figure 12:
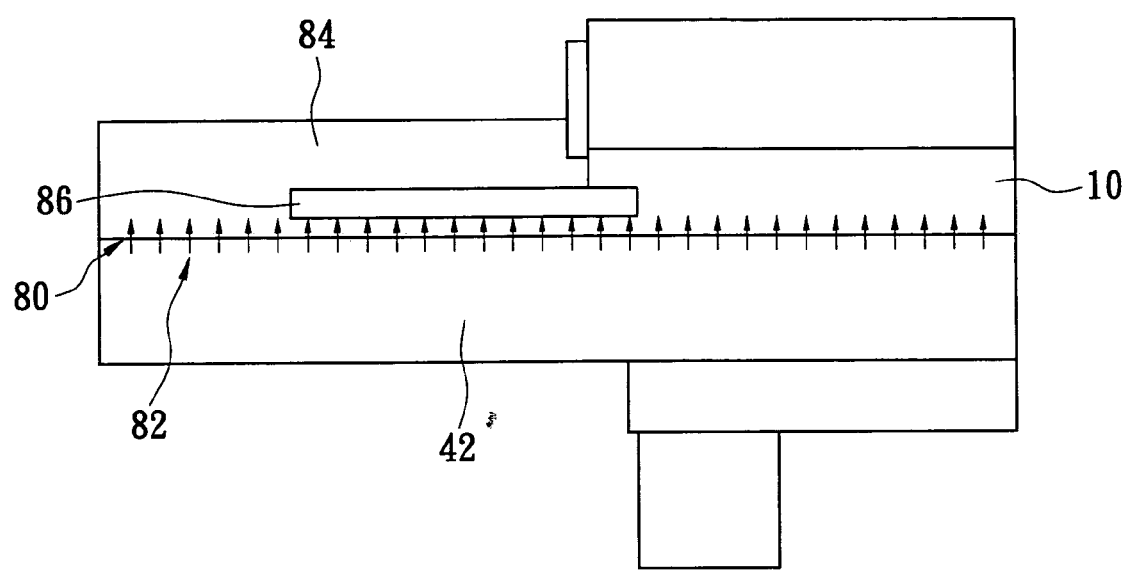
FIG. 12 is a perspective view of transporting the substrate by a floating force of the present invention.

In order to fill the gas in the manufacturing cavity rapidly, the volume of the manufacturing cavity is reduced to a minimum volume. Because the dimension of the substrate is fixed and cannot be reduced, the volume of the manufacturing cavity can be reduced by changing the manufacturing cavity's height. The top of the cavity is flat and close to the substrate, the narrow and small space is not suitable for transporting the substrate via a robot's arm. In order to overcome this problem, the transporting method is modified. The substrate is transported via a floating force, as shown in FIG. 12. There are a plurality of air holes 80 on the lower electrode plate 42. Each air hole 80 emits nitrogen or another inert gas 82. When the substrate is placed on the platform, each air hole on the platform emits nitrogen gas to lift the substrate a little; in other words it acts the same as an air cushion. Therefore, the substrate can be moved by a robot's arm or a piston to push the substrate to the desired location.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An apparatus having a large dimension plasma enhanced atomic layer deposition cavity, comprising:
    a large dimension plasma enhanced atomic layer deposition cavity, defining a reaction space;
    a first gas supply source, connected to the large dimension plasma enhanced atomic layer deposition cavity, for providing a first gas;
    a second gas supply source, connected to the large dimension plasma enhanced atomic layer deposition cavity, for providing a second gas;
    a purifying gas supply source valve that receives a pneumatic valve frequency signal; a purifying gas supply source, connected to the large dimension plasma enhanced atomic layer deposition cavity via the purifying gas supply source valve, for providing a purifying gas;
    a sensor, interlinked with the reaction space of the large dimension plasma enhanced atomic layer deposition cavity, for sensing pressure in the reaction space;
    a rotatable throttle valve interlinked with the reaction space of the large dimension plasma enhanced atomic layer deposition cavity, the rotatable throttle valve being placed in a space within which the rotatable throttle rotates and having a rotatable shaft with a first blade, a second blade, and a third blade mounted thereon, the second blade and the third blade extending bi-laterally with respect to each other from the rotatable shaft and the first blade being arranged substantially perpendicular to the second blade and the third blade, the first blade being used for controlling an effective cross section of a gas transmitting pipe through which gas is exhausted from the reaction space, and the second and third blades being used for sealing a movement opening of the space when the first blade is oriented to a predetermined position with the first blade, the second blade, and the third blade collectively ensuring thorough gas exhaustion from the reaction space, the rotatable throttle valve being driven to rotate via linear movement of a bearing base controlled and driven by a step motor which drives one of a belt, chain, rack and screw rod to change a position of the bearing base; and
    a throttle valve controller that receives a pressure signal from the sensor and generating at least one control signal to control the throttle valve;
    wherein the at least one control signal generated by the throttle valve controller includes an adjusting pressure valve position signal for the rotatable throttle valve to control pressure in the transmitting gas pipe, and the rotatable throttle valve is rotatable 180 degrees to a side without any of the blades in an exhaust passage to increase a gas flow through an exhaust region.

2. The apparatus of having a large dimension plasma enhanced atomic layer deposition cavity as claimed in claim 1, wherein the rotatable throttle valve is used for controlling and exhausting the first gas, the second gas and the purifying gas in the reaction space.

3. The apparatus having a large dimension plasma enhanced atomic layer deposition cavity as claimed in claim 1, wherein the pneumatic valve frequency signal is generated by a signal generator.

4. The apparatus having a large dimension plasma enhanced atomic layer deposition cavity as claimed in claim 1, wherein the valve position signal, the adjusting pressure valve position signal and a rotating frequency signal are generated by a signal generator.

5. The apparatus having a large dimension plasma enhanced atomic layer deposition cavity as according to claim 1, wherein the first blade is mounted substantially perpendicular to the second blade and the second blade is mounted substantially co-planar with the third blade.

6. A apparatus having a large dimension plasma enhanced atomic layer deposition cavity according to claim 1, wherein the first, second, and third blades are flat.

* * * * *